United States Patent
Dale

(12) 
(10) Patent No.: US 6,452,478 B1
(45) Date of Patent: Sep. 17, 2002

(54) VOLTAGE TRIMMABLE RESISTOR

(75) Inventor: Chuck Dale, Phoenix, AZ (US)

(73) Assignee: California Micro Devices, Milpitas, CA (US)

( * ) Notice: Subject to any disclaimer, the term of this patent is extended or adjusted under 35 U.S.C. 154(b) by 0 days.

(21) Appl. No.: 09/957,193

(22) Filed: Sep. 19, 2001

(51) Int. Cl.$^7$ ............................................. H01C 10/00
(52) U.S. Cl. ...................................... 338/195; 257/529
(58) Field of Search ................................ 338/195, 307; 257/529

(56) References Cited

U.S. PATENT DOCUMENTS

| | | | |
|---|---|---|---|
| 3,930,304 A | * | 1/1976 | Keller et al. ................. 338/195 |
| 4,150,366 A | * | 4/1979 | Price ........................... 338/195 |
| 4,338,590 A | * | 7/1982 | Connolly, Jr. et al. ...... 338/195 |
| 4,412,241 A | * | 10/1983 | Nelson ........................ 338/195 |
| 4,777,471 A | * | 10/1988 | Comer ......................... 338/195 |
| 5,394,019 A | | 2/1995 | Audy ........................... 327/525 |
| 5,493,148 A | * | 2/1996 | Ohata et al. ................. 338/195 |
| 5,710,538 A | * | 1/1998 | Zinn et al. ................... 338/195 |
| 5,757,264 A | * | 5/1998 | Petit ............................ 338/195 |
| 5,780,918 A | * | 7/1998 | Aoki ........................... 257/529 |

* cited by examiner

Primary Examiner—Karl D. Easthom
(74) Attorney, Agent, or Firm—Beyer Weaver & Thomas, LLP

(57) ABSTRACT

An adjustable resistor between a first terminal and a second terminal is provided. Generally, a plurality of resistors is provided comprising a set of trimmable resistors, where the trimmable resistors are electrically connected together in series, and a set of static resistors, where each static resistor is connected in parallel with a trimmable resistor of the set of trimmable resistors. A trim terminal and a plurality of diodes where each diode is electrically connected between a trimmable resistor and a trim terminal are also provided.

18 Claims, 8 Drawing Sheets

VOLTAGE TRIMMABLE RESISTOR

FIELD OF THE INVENTION

The present invention relates generally to trimmable resistors. More specifically, the invention relates to trimmable resistors for semiconductor devices.

BACKGROUND OF THE INVENTION

Trimmable resistors may be used with semiconductor devices. Trimmable resistors may be formed on semiconductor device substrates with semiconductor devices. Trimmable resistors allow a trimming that may change the resistance of a resistor after fabrication. Such trimming may be desired when the resistance in a resistor may vary due to manufacturing variations, the needed resistance for the semiconductor device may vary due to manufacturing variations, the needed resistance for the semiconductor device may vary due to the usage of the semiconductor device, or for other reasons.

Laser trimming uses a laser beam to cut electrical connections, which provide for the trimming of a resistor. Generally, such laser trimmable resistors provide a safe area where a laser beam may cut electrical connections. Due to the beam size and beam path, the safe areas may require significant die area to provide an area where only trimmable electrical circuits may be cut by the laser. Such a location should be free of other circuits and should provide sufficient separation between trimmable electrical circuits so that a laser beam only cuts the desired electrical circuits.

Some trimmable resistors may use an applied voltage to metal shorts. Some applied voltage trimmable resistors may require several trim pads, which use die space. Some applied voltage trimmable resistors may require large applied voltages, which may damage semiconductor devices.

Series and parallel switch combinations may also be used to provide trimmable resistors. These series and parallel switch combinations may require extra active circuitry on the die to control the switches. In addition, the trim results may only be valid when the control circuit is powered up.

It is desirable to have a trimmable resistor that requires a minimal amount of chip space and that does not require large voltages.

SUMMARY OF THE INVENTION

To achieve the foregoing and other objects and in accordance with the purpose of the present invention, an adjustable resistor between a first terminal and a second terminal is provided. Generally, a plurality of resistors is provided comprising a set of trimmable resistors, where the trimmable resistors are electrically connected together in series and a set of static resistors, where each static resistor is connected in parallel with a trimmable resistor of the set of trimmable resistors. A trim terminal and a plurality of diodes where each diode is electrically connected between a trimmable resistor and a trim terminal are also provided.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well-known process steps and/or structures have not been described in detail in order to not unnecessarily obscure the present invention. The values and theory in the embodiments below are provided to facilitate understanding, not to limit the scope of the claims.

Figure 1:
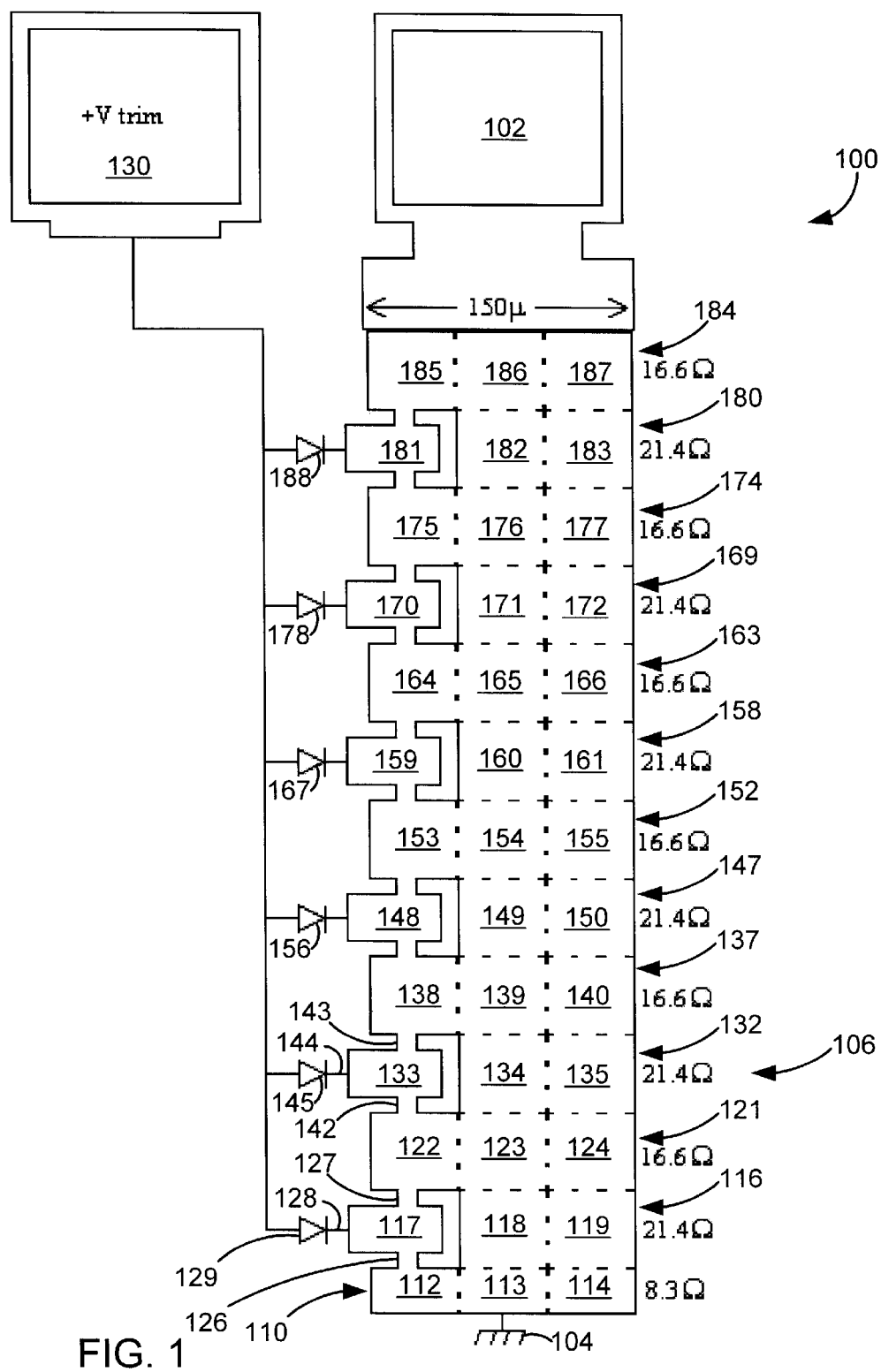
FIG. 1 is a schematic illustration of a trimmable resistor system.

FIG. 1 illustrates a preferred embodiment of the invention. A trimmable resistor system 100 is formed comprising a first terminal 102, a second terminal 104, and a adjustable resistor 106 extending between the first terminal 102 and the second terminal 104. The adjustable resistor 106 is formed by a plurality of resistors. A first row 110 of resistors of the plurality of resistors forms part of the adjustable resistor 106. The first row 110 comprises a first resistor 112, a second resistor 113, and a third resistor 114 and is electrically connected to the second terminal 104. A second row 116 of resistors of the plurality of resistors comprising a first resistor 117, a second resistor 118, and a third r esistor 119 is adjacent to and electrically connected to the first row 110 of resistors. The first resistor 117 of the second resistor row 116 is a first trimmable resistor of a set of trimmable resistors of the plurality of resistors. A third row 121 of resistors of the plurality of resistors comprising a first resistor 122, a second resistor 123, and a third resistor 124 is adjacent to and electrically connected to the second row 116 of resistors. The first trimmable resistor 117 has a first electrical connection 126, a second electrical connection 127, and a third electrical connection 128. The first electrical connection 126 electrically connects the first trimmable resistor 117 to the first resistor 112 of the first row 110. The second electrical connection 127 electrically connects the first trimmable resistor 117 to the first resistor 122 of the third row 121. The third electrical connection 128 electrically connects the first trimmable resistor 117 to a first end of a first diod e 129. A second end of the first diode 129 is electrically connected to a trim terminal 130. The first diode 129 is biased to allow current to flow from the trim terminal 130 to the first trimmable resistor 117.

A fourth row 132 of resistors of the plurality of resistors comprising a first resistor 133, a second resistor 134, and a third r esistor 135 is adjacent to and electrically connected to the third row 121 of resistors. The first resistor 133 of the fourth resistor row 132 is a second trimmable resistor of the set of trimmable resistors of the plurality of resistors. A fifth row 137 of resistors of the plurality of resistors comprising a first resistor 138, a second resistor 139, and a third resistor 140 is adjacent to and electrically connected to the fourth row 132 of resistors. The second trimmable resistor 133 has a first electrical connection 142, a second electrical connection 143, and a third electrical connection 144. The first electrical connection 142 electrically connects the second trimmable resistor 133 to the first resistor 122 of the third row 121. The second electrical connection 143 electrically connects the second trimmable resistor 133 to the first resistor 138 of the fifth row 137. The third electrical connection 144 electrically connects the second trimmable resistor 133 to a first end of a second diode 145. A second end of the second diode 145 is electrically connected to the trim terminal 130. The second diode 145 is biased to allow current to flow from the trim terminal 130 to the second trimmable resistor 133.

A sixth row 147 of resistors of the plurality of resistors comprising a first resistor 148, a second resistor 149, and a third resistor 150 is adjacent to and electrically connected to the fifth row 137 of resistors. The first resistor 148 of the sixth row 147 is a third trimmable resistor of the set of trimmable resistors of the plurality of resistors. A seventh row 152 of resistors of the plurality of resistors comprising a first resistor 153, a second resistor 154, and a third resistor 155 is adjacent to and electrically connected to the sixth row 147 of resistors. The third trimmable resistor 148 has a first electrical connection, a second electrical connection, and a third electrical connection. The first electrical connection electrically connects the third trimmable resistor 148 to the first resistor 138 of the fifth row 137. The second electrical connection electrically connects the third trimmable resistor 148 to the first resistor 153 of the seventh row 152. The third electrical connection electrically connects the third trimmable resistor 148 to a first end of a third diode 156. A second end of the third diode 156 is electrically connected to the trim terminal 130. The third diode 156 is biased to allow current to flow from the trim terminal 130 to the third trimmable resistor 148.

An eighth row 158 of resistors of the plurality of resistors comprising a first resistor 159, a second resistor 160, and a third resistor 161 is adjacent to and electrically connected to the seventh row 152 of resistors. The first resistor 159 of the eighth row 158 is a fourth trimmable resistor of the set of trimmable resistors of the plurality of resistors. A ninth row 163 of resistors of the plurality of resistors comprising a first resistor 164, a second resistor 165, and a third resistor 166 is adjacent to and electrically connected to the eighth row 158 of resistors. The fourth trimmable resistor 159 has a first electrical connection, a second electrical connection, and a third electrical connection. The first electrical connection electrically connects the fourth trimmable resistor 159 to the first resistor 153 of the seventh row 152. The second electrical connection electrically connects the fourth trimmable resistor 159 to the first resistor 164 of the ninth row 163. The third electrical connection electrically connects the fourth trimmable resistor 159 to a first end of a fourth diode 167. A second end of the fourth diode 167 is electrically connected to the trim terminal 130. The fourth diode 167 is biased to allow current to flow from the trim terminal 130 to the fourth trimmable resistor 159.

A tenth row 169 of resistors of the plurality of resistors comprising a first resistor 170, a second resistor 171, and a third resistor 172 is adjacent to and electrically connected to the ninth row 163 of resistors. The first resistor 170 of the tenth row 169 is a fifth trimmable resistor of the set of trimmable resistors of the plurality of resistors. An eleventh row 174 of resistors of the plurality of resistors comprising a first resistor 175, a second resistor 176, and a third resistor 177 is adjacent to and electrically connected to the tenth row 169 of resistors. The fifth trimmable resistor 170 has a first electrical connection, a second electrical connection, and a third electrical connection. The first electrical connection electrically connects the fifth trimmable resistor 170 to the first resistor 164 of the ninth row 163. The second electrical connection electrically connects the fifth trimmable resistor 170 to the first resistor 175 of the eleventh row 174. The third electrical connection electrically connects the fifth trimmable resistor 170 to a first end of a fifth diode 178. A second end of the fifth diode 178 is electrically connected to the trim terminal 130. The fifth diode 178 is biased to allow current to flow from the trim terminal 130 to the fifth trimmable resistor 170.

A twelfth row 180 of resistors of the plurality of resistors comprising a first resistor 181, a second resistor 182, and a third resistor 183 is adjacent to and electrically connected to the eleventh row 174 of resistors. The first resistor 181 of the twelfth row 180 is a sixth trimmable resistor of the set of trimmable resistors of the plurality of resistors. A thirteenth row 184 of resistors of the plurality of resistors comprising a first resistor 185, a second resistor 186, and a third resistor 187 is adjacent to and electrically connected to the twelfth row 180 of resistors. The sixth trimmable resistor 181 has a first electrical connection, a second electrical connection, and a third electrical connection. The first electrical connection electrically connects the sixth trimmable resistor 181 to the first resistor 175 of the eleventh row 174. The second electrical connection electrically connects the sixth trimmable resistor 181 to the first resistor 185 of the thirteenth row 184. The third electrical connection electrically connects the sixth trimmable resistor 181 to a first end of a sixth diode 188. A second end of the sixth diode 188 is electrically connected to the trim terminal 130. The sixth diode 188 is biased to allow current to flow from the trim terminal 130 to the sixth trimmable resistor 181.

To facilitate understanding, in an example of this embodiment, each resistor in the first, third, fifth, seventh, ninth, eleventh, and thirteenth rows 110, 121, 137, 152, 163, 174, 184 is approximately 50 microns wide. The second and third resistors in the second, fourth, sixth, eighth, tenth, and twelfth rows 116, 132, 147, 158, 169, 180 are also approximately 50 microns wide. The first through sixth trimmable resistors 117, 133, 148, 159, 170, 181 have an irregular width. Each resistor in the third, fifth, seventh, ninth, eleventh, and thirteenth rows 121, 137, 152, 163, 174, 184 is approximately 50 microns long. The second and third resistors in the second, fourth, sixth, eighth, tenth, and twelfth rows 116, 132, 147, 158, 169, 180 are also approximately 50 microns long. The resistors 112, 113, 114 in the first row are approximately 25 microns long. The first through sixth trimmable resistors 117, 133, 148, 159, 170, 181 with the lengths of the first and second electrical connections are about 50 microns long. In this example, all resistors are formed by a uniform layer of an electrically conductive and resistive material and thickness so that each resistor in the third, fifth, seventh, ninth, eleventh, and thirteenth rows 121, 137, 152, 163, 174, 184 and the second and third resistors in the second, fourth, sixth, eighth, tenth, and twelfth rows 116, 132, 147, 158, 169, 180 have a resistance of approximately 50 ohms and so that the resistors 112, 113, 114 in the first row have a resistance of approximately 25 ohms. Such a material may be tantalum or tantalum nitride. The first through sixth trimmable resistors 117, 133, 148, 159, 170, 181 with their first and second electrical connections have a resistance of approximately 150 ohms. The layer has the characteristic of melting when approximately 6 mA/micron width of current flows through the layer. Other dimensions and resistances may be used in other embodiments.

As shown in FIG. 1, if a voltage is applied between the first terminal 102 and the second terminal, the resistance from the adjustable resistor 106 would be the sum of the resistances of the first through thirteenth rows 110, 116, 121, 132, 137, 147, 152, 158, 163, 169, 174, 180, 184, since these rows are in series. Resistors in the same row are in a generally parallel relationship. The first, second, and third resistors 112, 113, 114 of the first row 110 are in parallel and so the resistance of the first row would be $1/R_1+1/R_2+1/R_3=1/R_{ROW}$. So $1/25+1/25+1/25=1/R_{ROW}$. Therefore, the resistance of the first row $R_{ROW}$=8.3 ohms. For the third, fifth, seventh, ninth, eleventh, and thirteenth rows 121, 137, 152, 163, 174, 184, where the resistance in each first, second, and third resistor is 50 ohms, the resistance of the row would be $1/R_1+1/R_2+1/R_3=1/R_{ROW}$. So $1/50+1/50+1/50=1/R_{ROW}$. Therefore, the resistance for each of the third, fifth, seventh, ninth, eleventh, and thirteenth rows 121, 137, 152, 163, 174, 184 is 16.6 ohms. For the second, fourth, sixth, eighth, tenth, and twelfth rows 116, 132, 147, 158, 169, 180, where the resistance in the first resistor is 150 ohms and the resistance in the second and third resistor is 50 ohms, the resistance of the row would be $1/R_1+1/R_2+1/R_3=1/R_{ROW}$. So $1/150+1/50+1/50=1/R_{ROW}$. Therefore, the resistance for the second, fourth, sixth, eighth, tenth, and twelfth rows 116, 132, 147, 158, 169, 180 is about 21.4 ohms. Therefore, the total resistance of the adjustable resistor 106 as shown in FIG. 1 would be the sum of the resistance of all rows, which would be about 236.3 ohms. The diodes 129, 145, 156, 167, 178, 188 help prevent current from flowing through the third connections 129, 145 to the trimmable resistors 117, 133, 148, 159, 170, 181, which would cause a short between the trimmable resistors and decrease the total resistance between the first and second terminals 102, 104.

Since the rows of resistors are in series, trimmable resistors in different rows are electrically connected together in series. The resistors that are in the same row as a trimmable resistor are parallel to the trimmable resistor. These resistors that are not trimmable (non-trimmable) and are parallel to a trimmable resistor, because they are in the same row, are called in the specification and claims "static resistors". Although, in this embodiment, two static resistors are shown as parallel to a trimmable resistor in each row, one or more static resistors may be placed in parallel to a trimmable resistor. In addition, although the non-trimmable resistors in each row are shown as two or three separate resistors formed by a single layer, the nontrimmable resistors in a row may be considered as a single resistor. Considering and claiming them as two or three separate resistors is done to facilitate understanding in calculating resistance of the row of resistors and to facilitate understanding of the claims.

In this example, the width of the electrical connections to the trimmable resistors is about 5 microns. To obtain a current that allows one of the electrical connections to a trimmable resistor to be blown, a current of approximately 5 microns×6 mA/micron=30 mA. To blow an electrical connection, a voltage is applied between the trim terminal 130 and the second terminal 104, which in this example is connected to ground. Most of the current from such an applied voltage would flow through the first diode 129 to the first trimmable resistor 117, and through the first electrical connection 126, and through the first row 110 of resistors to the second terminal 104. The resistance along this electrical path is the sum of the resistance of the first trimmable resistor 117 when voltage is applied through the first diode, the first electrical connection 126 of the first trimmable resistor, and the first row 110 of resistors, which is about 50 ohms+8.3 ohms=58.3 ohms. To obtain a current of about 30 mA with this resistance, a voltage of about 30 mA×58 ohms+0.7V (the forward voltage of the first diode)=2.45 volts would be needed. Although other parallel electrical paths are available between the trim terminal 130 and the second terminal 104, these other electrical paths have a higher resistance, and therefore a lower current flow. The application of slightly more than about 2.45 volts between the trim pad 130 and the second terminal 104 would cause about 30 mA to flow through the first electrical connection 126 of the first trimmable resistor 117, which causes the first electrical connection 126 to melt.

Figure 2:
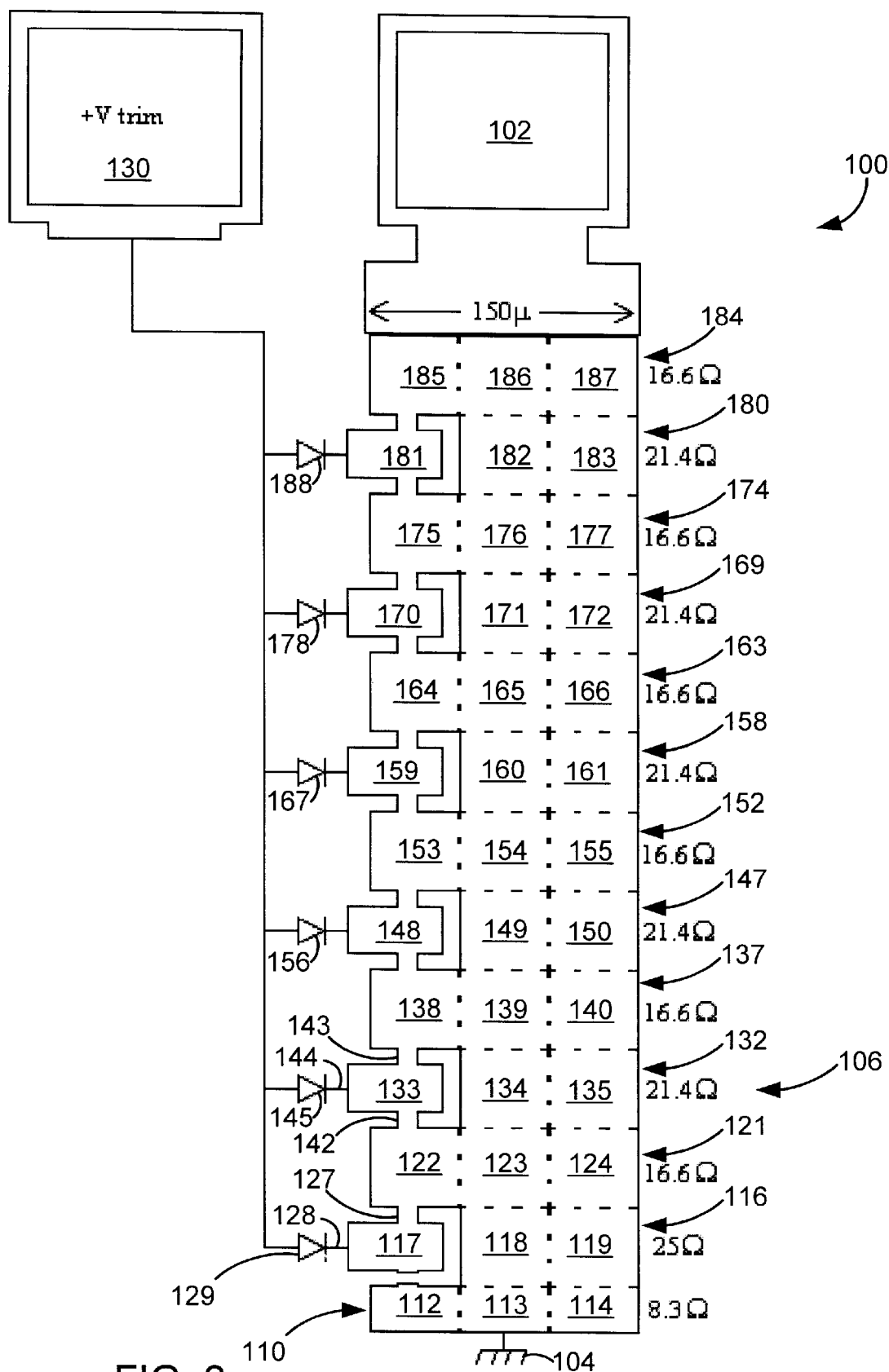
FIG. 2 illustrates the trimmable resistor system after a first electrical connection of a first trimmable resistor has been melted.

FIG. 2 illustrates the trimmable resistor system 100 after the first electrical connection 126 of the first trimmable resistor 117 has been melted. If a voltage is applied between the first terminal 102 and the second terminal 104, current does not flow through the first trimmable resistor 117. The resistance caused by the second row 116 is now $1/R_2+1/R_3=1/R_{ROW}$. So $1/50+1/50=1/R_{ROW}$. Therefore, the resistance in the second row is now 25 ohms, so that the resistance in the second row has changed from 21.4 ohms to 25 ohms. Since the resistance in the other rows remains unchanged, the total resistance of the adjustable resistor 106 as shown in FIG. 2 has changed from about 236.3 ohms to about 239.9 ohms.

To blow the first electrical connection 142 of the second trimmable resistor 133, a voltage is applied between the trim terminal 130 and the second terminal 104, which in this example is connected to ground. Most of the current from such an applied voltage would first flow through the first diode 129 to the first trimmable resistor 117, and through the second electrical connection 127, and through the third row 121 of resistors, the second and third resistors 118, 119 of the second row of resistors, and the first row of resistors to the second terminal 104. The resistance along this electrical path is the sum of the resistance of the first trimmable resistor 117 when voltage is applied through the first diode, the second electrical connection 127 of the first trimmable resistor, the second and third resistors of the second row of resistors 116, and the first row 110 of resistors, which is about 50 ohms+25 ohms+8.3 ohms=83.3 ohms. To obtain a current of about 30 mA with this resistance, a voltage of about 30 mA×83.3 ohms+0.7V (the forward voltage of the first diode)=3.2 volts would be needed. Next, the current would blow the first electrical connection 142 of the second trimmable resistor 133. Most of the current would flow through the second diode 145 to the second trimmable resistor 133 (since the first trimmable resistor 117 has been electrically isolated), through the first electrical connection 142 of the second trimmable resistor 133, through the third row of resistors 121, through the second and third resistors 118, 119 of the second row of resistors 116, and through the first row of resistors 110 to the second terminal 104. The resistance along this electrical path is the sum of the resistance of the second trimmable resistor 133 when voltage is applied through the second diode 145, the first electrical connection 142 of the second trimmable resistor 133, the third row of resistors 121, the second and third resistors of the second row of resistors 116, and the first row 110 of resistors, which is about 50 ohms+16.6 ohms+25 ohms+8.3 ohms=99.9 ohms. To obtain a current of about 30 mA with this resistance, a voltage of about 30 mA×99.9 ohms+0.7V (the forward voltage of the second diode)=3.7 volts would be needed.

Therefore, when a voltage of slightly more than about 3.7 volts is applied between the trim terminal 130 and the second terminal 104, although other parallel electrical paths are available between the trim terminal 130 and the second terminal 104 because of the lower resistance, most of the current will flow through the first trimmable resistor 117 and the second electrical connection 127, which will cause the second electrical connection 127 of the first trimmable resistor 117 to melt. Most of the electrical current would then flow through the second diode 145 to the second trimmable resistor 133, which would cause about 30 mA to flow through the first electrical connection 142 of the second trimmable resistor 133, which causes the first electrical connection 142 of the second trimmable resistor 133 to melt.

Figure 3:
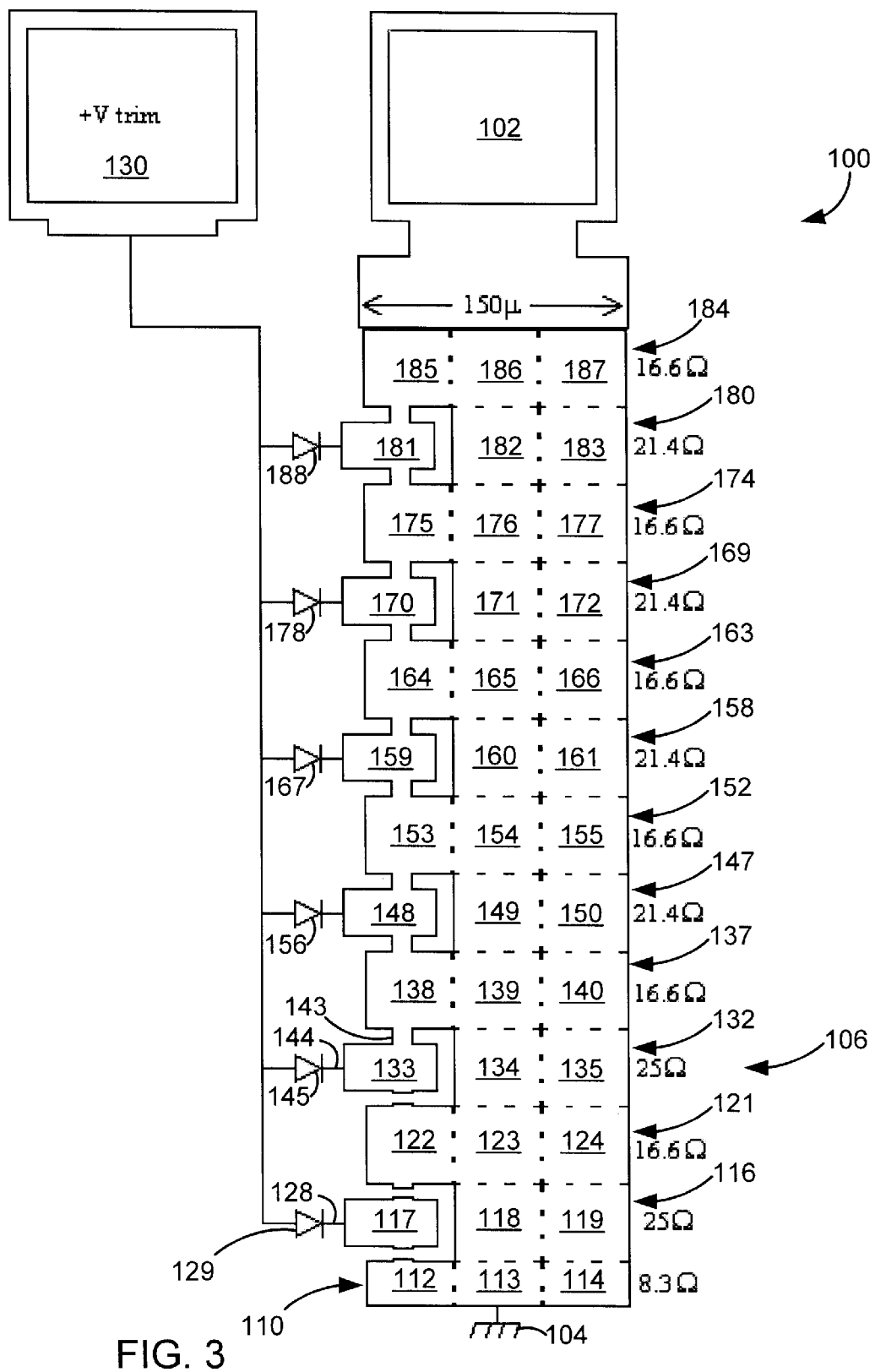
FIG. 3 illustrates the trimmable resistor system after a first electrical connection of a second trimmable resistor has been melted.

FIG. 3 illustrates the trimmable resistor system 100 after the first electrical connection 142 of the second trimmable resistor 133 has been melted. If a voltage is applied between the first terminal 102 and the second terminal 104, current does not flow through the first trimmable resistor 117 and the second trimmable resistor 133. The resistance caused by the fourth row 132 is now $1/R_2+1/R_3=1/R_{ROW}$. So $1/50+1/50=1/R_{ROW}$. Therefore, the resistance in the fourth row is now 25 ohms, so that the resistance in the fourth row has changed from 21.4 ohms to 25 ohms. Since the resistance in the other rows remains unchanged, the total resistance of the adjustable resistor 106 as shown in FIG. 3 has changed from about 236.3 ohms (in FIG. 1) to about 243.5 ohms.

To blow the first electrical connection of the third trimmable resistor 148, a voltage is applied between the trim terminal 130 and the second terminal 104, which in this example is connected to ground. Most of the current from such an applied voltage would first flow through the second diode 145 to the second trimmable resistor 133, and through the second electrical connection 143 of the second trimmable resistor 133, and through the fifth row 137 of resistors, the second and third resistors 134, 135 of the fourth row of resistors 132, the third row 121 of resistors, the second and third resistors 118, 119 of the second row of resistors, and the first row of resistors to the second terminal 104. The resistance along this electrical path is the sum of the resistance of the second trimmable resistor 133 when voltage is applied through the second diode, the second electrical connection 143 of the second trimmable resistor 133, the second and third resistors of the fourth row of resistors 132, the third row of resistors 121, the second and third resistors of the second row of resistors 116, and the first row 110 of resistors, which is about 50 ohms+25 ohms+16.6 ohms+25 ohms+8.3 ohms=124.9 ohms. To obtain a current of about 30 mA with this resistance, a voltage of about 30 mA×124.9 ohms+0.7V (the forward voltage of the first diode)=4.45 volts would be needed. Next, the current would blow the first electrical connection of the third trimmable resistor 148. Most of the current would flow through the third diode 156 to the third trimmable resistor 148 (since the second trimmable resistor 133 has also been electrically isolated), through the first electrical connection of the third trimmable resistor 148, through the fifth row of resistors 137, through the second and third resistors 134, 135 of the fourth row of resistors 132, through the third row of resistors 121, through the second and third resistor 118, 119 of the second row of resistors 116, and through the first row of resistors 110 to the second terminal 104. The resistance along this electrical path is the sum of the resistance of the third trimmable resistor 148 when voltage is applied through the third diode 156, the first electrical connection of the third trimmable resistor 148, the fifth row of resistors 137, the second and third resistors of the fourth row of resistors 132, the third row of resistors 121, the second and third resistors of the second row of resistors 116, and the first row 110 of resistors, which is about 50 ohms+16.6 ohms+25 ohms+16.6 ohms+25 ohms+8.3 ohms=141.5 ohms. To obtain a current of about 30 mA with this resistance, a voltage of about 30 mA×141.5 ohms+0.7V (the forward voltage of the second diode)=4.95 volts would be needed.

Therefore, when a voltage of slightly more than about 4.95 volts is applied between the trim terminal 130 and the second terminal 104, although other parallel electrical paths are available between the trim terminal 130 and the second terminal 104 because of the lower resistance, most of the current will flow through the second trimmable resistor 133 and the second electrical connection 143, which will cause the second electrical connection 143 of the second trimmable resistor 133 to melt. Most of the electrical current would then flow through the third diode 156 through to the third trimmable resistor 148, which would cause about 30 mA to flow through the first electrical connection of the third trimmable resistor 148, which causes the first electrical connection of the third trimmable resistor 148 to melt.

Figure 4:
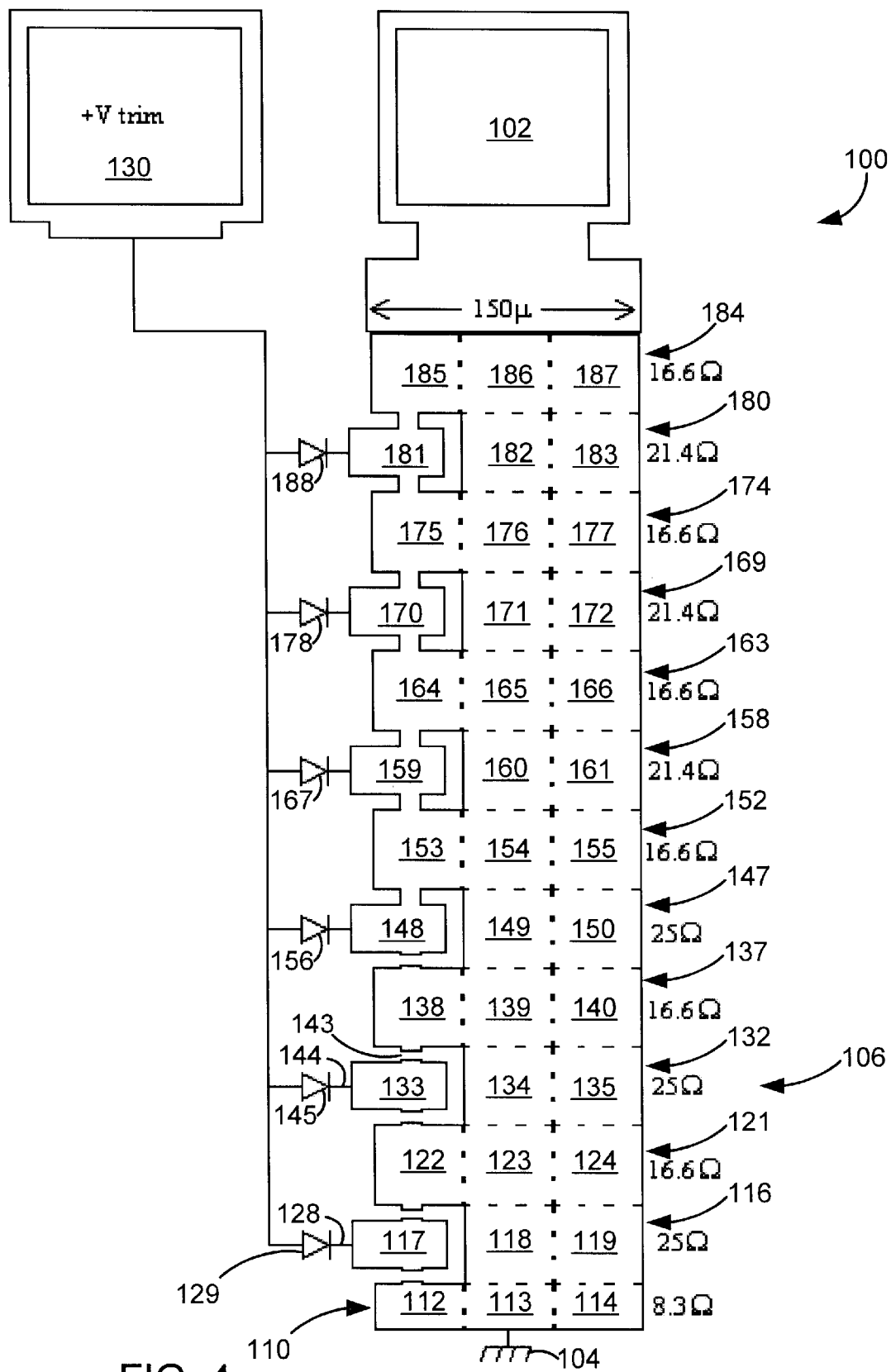
FIG. 4 illustrates the trimmable resistor system after a first electrical connection of a third trimmable resistor has been melted.

FIG. 4 illustrates the trimmable resistor system 100 after the first electrical connection of the third trimmable resistor 148 has been melted. If a voltage is applied between the first terminal 102 and the second terminal 104, current does not flow through the first trimmable resistor 117, the second trimmable resistor 133, and the third trimmable resistor 148. The resistance caused by the sixth row 147 is now $1/R_2+1/R_3=1/R_{ROW}$. So $1/50+1/50=1/R_{ROW}$. Therefore, the resistance in the sixth row is now 25 ohms, so that the resistance in the sixth row has changed from 21.4 ohms to 25 ohms. Since the resistance in the other rows remains unchanged, the total resistance of the adjustable resistor 106 as shown in FIG. 4 has changed from about 236.3 ohms (in FIG. 1) to about 247.1 ohms.

This process may be repeated for the remaining electrical connections for the trimmable resistors. In this example, the voltages to melt the remaining electrical connections for the trimmable resistors may be as follows: The second electrical connection of the third trimmable resistor 148 may be melted when a voltage of about 5.7 volts is applied between the trim pad 130 and the second terminal. The first electrical connection of the fourth trimmable resistor 159 may be melted when a voltage of about 6.2 volts is applied between the trim pad 130 and the second terminal 104. The total resistance of the adjustable resistor 106 at this stage would be about 250.7 volts. The second electrical connection of the fourth trimmable resistor 159 may be melted when a voltage of about 6.95 volts is applied between the trim pad 130 and the second terminal. The first electrical connection of the fifth trimmable resistor 170 may be melted when a voltage of about 7.45 volts is applied between the trim pad 130 and the second terminal 104. The total resistance of the adjustable resistor 106 at this stage would be about 254.3 ohms.

Figure 5:
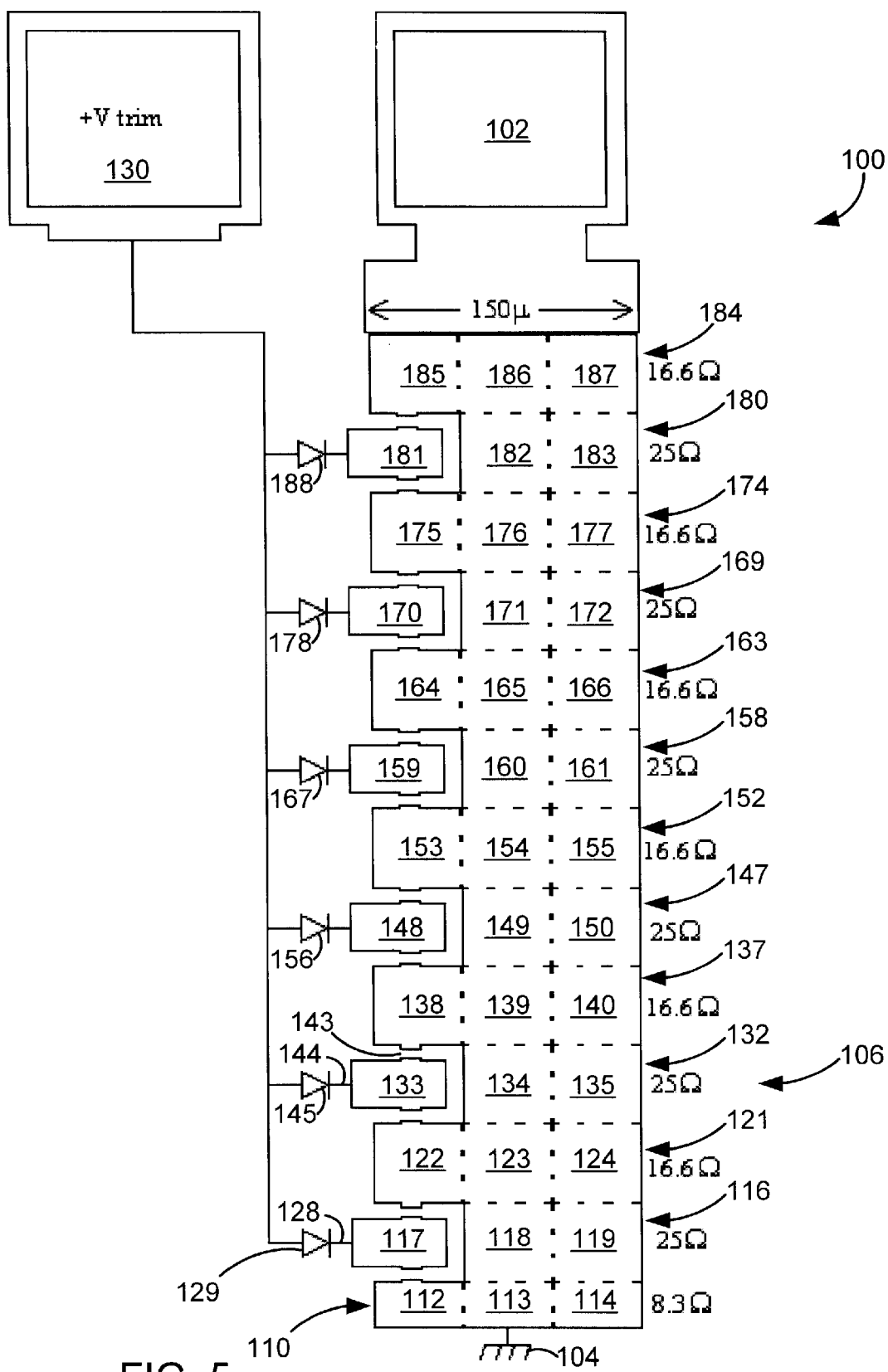
FIG. 5 illustrates the trimmable resistor system after a second electrical connection of a sixth trimmable resistor has been melted.

The second electrical connection of the fifth trimmable resistor 170 may be melted when a voltage of about 8.2 volts is applied between the trim pad 130 and the second terminal. The first electrical connection of the sixth trimmable resistor 181 may be melted when a voltage of about 8.7 volts is applied between the trim pad 130 and the second terminal 104. The total resistance of the adjustable resistor 106 at this stage would be about 257.9 ohms. The second electrical connection of the sixth trimmable resistor 181 may be melted when a voltage of about 9.45 volts is applied between the trim pad 130 and the second terminal. FIG. 5 illustrates the adjustable resistor 106 after the second electrical connection of the sixth trimmable resistor 181 has been melted.

Since only 9.45 volts is the highest voltage required by this embodiment to create the highest resistance, this example allows the adjustable resistor to be fully adjusted without requiring a voltage of more than 10 volts, so that the circuitry would not require a damaging high voltage to provide the highest resistance.

Different geometries may provide different resistance ratios between the trimmable resistors and the static resistors, current and voltage capacities, and resistance adjustments. Generally, the dimensions should be set so that the adjustable resistor does not melt using normal operating voltages applied between the first and second terminals.

Figure 6:
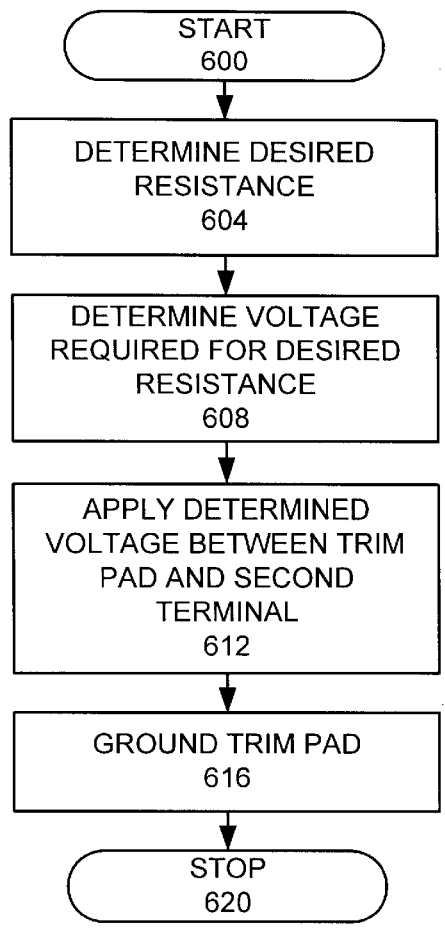
FIG. 6 is a flow chart of a first method of trimming a trimmable resistor system.

In a first method of trimming the trimmable resistor system 100, as shown in FIG. 6, a desired resistance is determined. For example, a desired resistance of 247.1 ohms may be determined (step 604). As calculated above, in this embodiment it is determined that a voltage of about 4.95 volts applied between the trim pad 130 and the second terminal 104 would adjust the adjustable resistor 106 to a voltage of about 247.1 ohms (step 608). The determined voltage of 4.95 volts is applied between the trim pad 130 and the second terminal 104 (step 612). This results in the melting of the first electrical connection of the third trimmable resistor 148 and any remaining first or second electrical connection of the first and second trimmable resistors 117, 133. Once the desired resistance is reached, the trim pad 130 may be grounded (step 616) so that stray voltages will not further melt any electrical connection.

Figure 7:
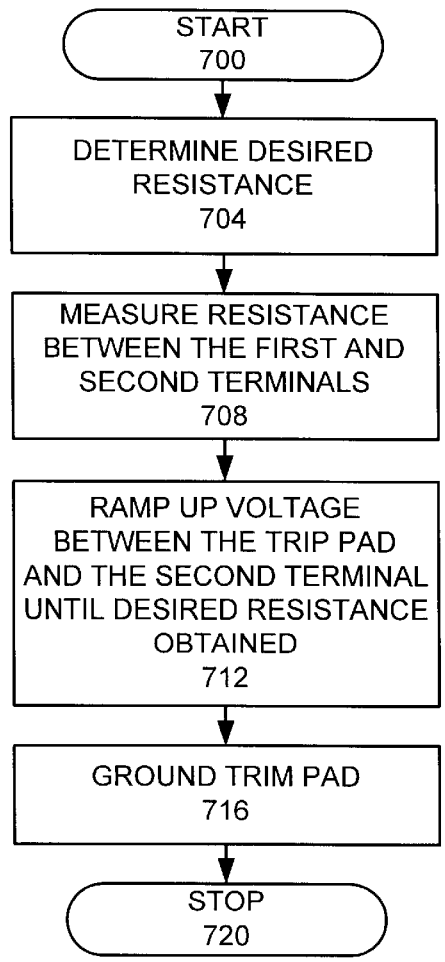
FIG. 7 is a flow chart of a second method of trimming a trimmable resistor system.

In a second method of trimming the trimmable resistor system 100, as shown in FIG. 7, a desired resistance is determined (step 704). For example, a resistance above 238 ohms may be desired. An ohmmeter may be placed between the first terminal 102 and the second terminal 104, which initially may measure a resistance of about 236.3 ohms (step 708). A voltage is applied between the trim pad and the second terminal 104. The voltage is slowly ramped up until the desired resistance is obtained (step 712), i.e., the resistance is above 238 ohms. The trim pad 130 may then be grounded to prevent any further increase in voltage (step 716). An advantage to this method is that, if the manufacturing of the adjustable resistor is not precise, the required voltage may be empirically found.

Figure 8:
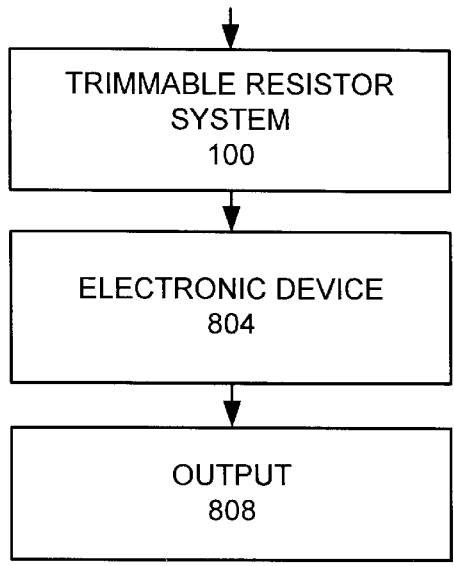
FIG. 8 is a schematic illustration of a circuit that uses a trimmable resistor.
Figure 9:
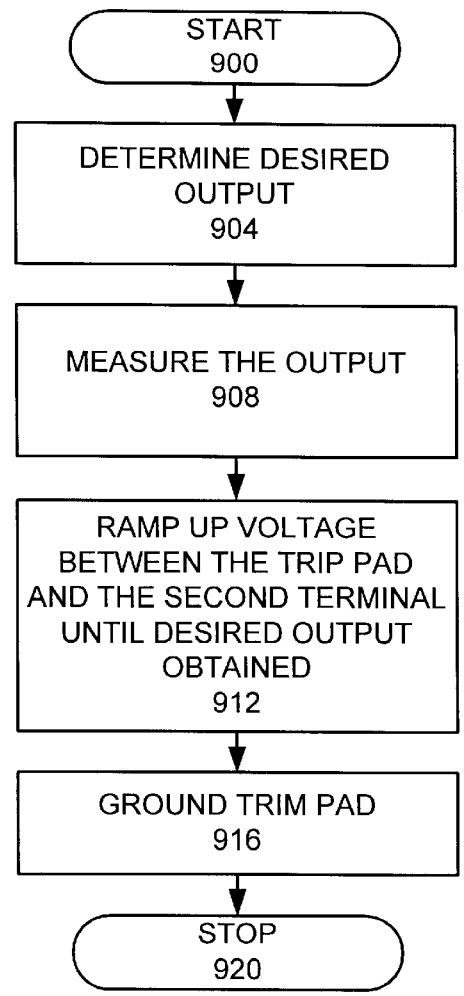
FIG. 9 is a flow chart of a third method of trimming a trimmable resistor system, as shown in FIG. 8.

FIG. 8 is a schematic illustration of part of a circuit, which may use a third method for trimming a trimmable resistor system 100, as shown in FIG. 9. The circuitry shown in FIG. 8 comprises a trimmable resistor system 100 electrically connected to an electronic device 804, which provides output 808. An example of an electronic device 804 may be an operational amplifier, where the trimmable resistor system 100 is connected to an input of the op amp to trim out the offset at the input stages of the op amp. A desired output is determined (step 904). The output is measured (step 908). A voltage between the trim pad and the second terminal is ramped until the desired output is obtained (step 912). The trim pad 130 is then grounded (step 916). This method is desirable, when the desired resistance is not known, but only a desired output. Such a situation is caused by manufacturing of an electronic device that may not be precise. This method allows for proper trimming of such electronic systems that may be made with some variability. Since a low voltage is required to trim the adjustable resistor, damage to the electronic device is avoided. In other embodiments, the adjustable resistor may be electronically connected to the output of the electronic device. An additional trim pad may be added between the trimmable resistor system 100 and the electronic device 804 to allow the trim voltage to be grounded.

Figure 10:
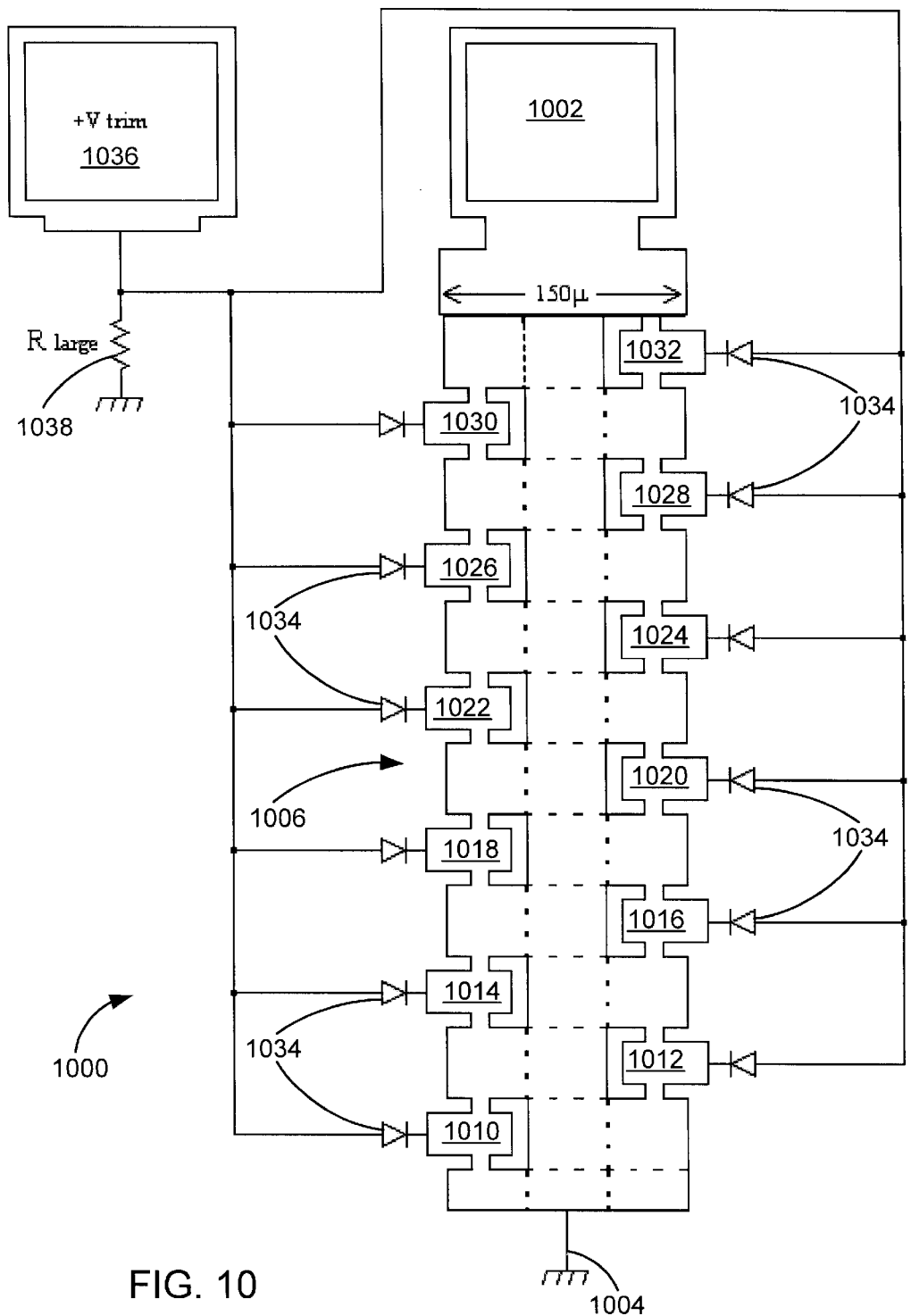
FIG. 10 illustrates another trimmable resistor system.

FIG. 10 illustrates another embodiment of a trimmable resistor system 1000. As in the previous embodiment, the trimmable resistor system 1000 is formed comprising a first terminal 1002, a second terminal 1004, and an adjustable resistor 1006 extending between the first terminal 1002 and the second terminal 1004. The adjustable resistor 1006 is formed by a plurality of resistors in a plurality of rows. In this embodiment, trimmable resistors are placed in the second through thirteenth rows of the adjustable resistor 1006. A first trimmable resistor 1010 is placed as a first resistor in the second row of resistors. A second trimmable resistor 1012 is placed as a third resistor in the third row of resistors. A third trimmable resistor 1014 is placed as a first resistor in the fourth row of resistors. A fourth trimmable resistor 1016 is placed as a third resistor in the fifth row of resistors. A fifth trimmable resistor 1018 is placed as a first resistor in the sixth row of resistors. A sixth trimmable resistor 1020 is placed as a third resistor in the seventh row of resistors. A seventh trimmable resistor 1022 is placed as a first resistor in the eighth row of resistors. An eighth trimmable resistor 1024 is placed as a third resistor in the ninth row of resistors. A ninth trimmable resistor 1026 is placed as a first resistor in the tenth row of resistors. A tenth trimmable resistor 1028 is placed as a third resistor in the eleventh row of resistors. An eleventh trimmable resistor 1030 is placed as a first resistor in the twelfth row of resistors. A twelfth trimmable resistor 1032 is placed as a third resistor in the thirteenth row of resistors. As in the previous embodiment, a plurality of diodes 1034 is provided so that each diode 1034 electrically connects a trimmable resistor to a trim pad 1036. The diodes 1034 are biased to allow current to flow from the trim pad 1036 to the trimmable resistors. The trim pad 1036 may be connected to ground through a large resistor 1038 to keep the diodes 1034 from floating. The large resistor 1038 between the trim pad and ground provides a device for grounding the trim pad after the trimming is completed.

If this adjustable resistor 1006 is made of the same material and has similar dimensions to the previous embodiment, then the first row of resistors would have a resistance of about 8.3 ohms, and the remaining rows of resistors would have a resistance of about 21.4 ohms when a trimmable resistor is connected in the row or a resistance of about 25 ohms when a trimmable resistor is disconnected in the row. Since a trimmable resistor is placed in almost every row, this embodiment provides a greater amount of adjustment than the previous embodiment. The purpose of staggering the trimmable resistors between the first resistor and the third resistor in a row is to allow the trimmable resistors to be connected in series with each other and in parallel with a static resistor so that, if a trimmable resistor is disconnected, an electrical path between the first terminal 1002 and the second terminal 1004 is maintained.

In other embodiments of the invention, a trimmable resistor may be formed in various configurations to provide a resistor, which is trimmable. For example, a trimmable resistor may comprise two or more trimmable resistors in parallel. Such trimmable resistors in parallel may be disconnected sequentially, providing more resistor adjustable values or simultaneously providing greater changes in resistance. Such parallel trimmable resistors forming a single trimmable resistor may each be connected to a diode connected to a trim pad.

Although illustrated as a pad, the first terminal may be any type of terminal of a resistor.

While this invention has been described in terms of several preferred embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. An adjustable resistor between a first terminal and a second terminal, comprising:
    a plurality of resistors, comprising:
        a set of trimmable resistors, wherein the trimmable resistors are electrically connected together in series; and
        a set of static resistors, wherein each static resistor is connected in parallel with a trimmable resistor of the set of trimmable resistors;
    a trim terminal; and
    a plurality of diodes, wherein each diode is electrically connected between a trimmable resistor and a trim terminal.

2. The adjustable resistor, as recited in claim 1, wherein each trimmable resistor of the set of trimmable resistors comprises a first electrical connection, a second electrical connection, and a third electrical connection, wherein the first electrical connection provides an electrical connection between the trimmable resistor and a resistor of the plurality of resistors, and wherein the second electrical connection provides an electrical connection between the trimmable resistor and another resistor of the plurality of resistors, and wherein the third electrical connection provides an electrical connection between the trimmable resistor and a diode of the plurality of diodes.

3. The adjustable resistor, as recited in claim 2, wherein the plurality of resistors are formed by a film on an insulating substrate.

4. The adjustable resistor, as recited in claim 3, wherein the diodes are biased to allow current to pass from the trim terminal to a trimmable resistor.

5. The adjustable resistor, as recited in claim 4, wherein the adjustable resistor is in the form of a plurality of rows wherein each row of the plurality of rows is in series with an adjacent row, wherein the series extends between the first terminal and the second terminal.

6. The adjustable resistor, as recited in claim 5, wherein a trimmable resistor and a static resistor in parallel with the trimmable resistor forms at least part of a row of the plurality of rows.

7. The adjustable resistor, as recited in claim 6, wherein every other row of the plurality of rows comprises a trimmable resistor of the set of trimmable resistors.

8. The adjustable resistor, as recited in claim 6, wherein adjacent rows of the plurality of rows comprise a trimmable resistor of the set of trimmable resistors.

9. The adjustable resistor, as recited in claim 8, wherein trimmable resistors in adjacent rows are placed in a staggered relationship.

10. The adjustable resistor, as recited in claim 9, wherein each trimmable resistor has a minimum cross-sectional area and wherein the first connection has a minimum cross-sectional area, wherein the minimum cross-sectional area of the trimmable resistor is greater than the minimum cross-sectional area of the first connection.

11. The adjustable resistor, as recited in claim 1, wherein the plurality of resistors are formed by a film on an insulating substrate.

12. The adjustable resistor, as recited in claim 1, wherein the diodes are biased to allow current to pass from the trim terminal to a trimmable resistor.

13. The adjustable resistor, as recited in claim 1, wherein the adjustable resistor is in the form of a plurality of rows wherein each row of the plurality of rows is in series with an adjacent row, wherein the series extends between the first terminal and the second terminal.

14. The adjustable resistor, as recited in claim 13, wherein a trimmable resistor and a static resistor in parallel with the trimmable resistor form at least part of a row of the plurality of rows.

15. The adjustable resistor, as recited in claim 14, wherein every other row of the plurality of rows comprises a trimmable resistor of the set of trimmable resistors.

16. The adjustable resistor, as recited in claim 14, wherein adjacent rows of the plurality of rows comprise a trimmable resistor of the set of trimmable resistors.

17. The adjustable resistor, as recited in claim 16, wherein trimmable resistors in adjacent rows are placed in a staggered relationship.

18. The adjustable resistor, as recited in claim 1, wherein each trimmable resistor has a minimum cross-sectional area and wherein the first connection has a minimum cross-sectional area, wherein the minimum cross-sectional area of the trimmable resistor is greater than the minimum cross-sectional area of the first connection.

* * * * *